United States Patent

Swanson

[15] 3,643,182

[45] Feb. 15, 1972

[54] COMPACT DISTRIBUTED-PARAMETER NETWORK

[72] Inventor: Carl R. Swanson, Des Plaines, Ill.

[73] Assignee: Zenith Radio Corporation, Chicago, Ill.

[22] Filed: Dec. 14, 1970

[21] Appl. No.: 97,858

[52] U.S. Cl. ................................333/29, 333/23, 333/31 C, 333/84 R

[51] Int. Cl..........................................H03h 7/34, H04b 3/40

[58] Field of Search ..............333/29, 31, 31 C, 70, 84, 84 M, 333/23

[56] References Cited

UNITED STATES PATENTS 2,832,935 4/1958 Tank........................................333/29

*Primary Examiner*—Herman Karl Saalbach

*Assistant Examiner*—Marvin Nussbaum

*Attorney*—John J. Pederson

[57] ABSTRACT

A compact distributed-parameter network for transmission of applied electrical signals with a predetermined characteristic impedance, comprising a substrate of dielectric material having at least two parallel major surfaces with a coil of coplanar turns of electrically conductive material in a spirallike configuration of concentric squares in the center area of the coil and of concentric octagons in the outer area of the coil affixed to and supported by one of the parallel major surfaces, and a ground plane comprising a plurality of electrically joined segments of electrically conductive material affixed to and supported by the parallel major surface opposite the spirallike coil in asymmetrical juxtaposition therewith.

9 Claims, 5 Drawing Figures

Inventor
Carl R. Swanson
By John J. Pederson
Attorney

COMPACT DISTRIBUTED-PARAMETER NETWORK

BACKGROUND OF THE INVENTION

The invention relates to a novel compact distributed-parameter network for transmission of applied electrical signals which can be made with thick-film microcircuit processing techniques, and which can be included on a thick-film microcircuit substrate if so desired. The network makes it possible to achieve greater frequency bandwidths then heretofore obtainable with similar structures and provides a convenient means for optimizing the phase response of electrical signals applied to it.

Since the introduction of solid-state technology, there has been an ever increasing demand for thick-film microcircuits. Such circuits can comprise a substrate of dielectric material with a pattern of strips of electrically conductive material deposited onto the surface of the substrate to interconnect deposited or discrete circuit elements such as transistors, capacitors and resistors.

Unfortunately, when it has been necessary in the past to provide thick-film microcircuits with networks of inductance and capacitance, the prior art constructions have resulted in poor transmission efficiency and narrow-frequency bandwidths. They also have not provided a means for conveniently optimizing the phase response of electrical microcircuit signals applied to them. The common prior art construction comprises a spiral coil on one side of a dielectric substrate and a unitary ground plane of conductive material lying beneath the spiral coil on the opposite side of the substrate. Because the ground plane is of one continuous sheet, the eddy currents induced in the ground plane cause substantial power losses reducing its transmission efficiency and also narrowing its frequency bandwidth. This construction also does not provide for optimizing the phase response of electrical signals applied to it. Even though such prior art constructions are at least largely compatible with microcircuit manufacturing techniques, their use is limited for the reasons previously stated.

Therefore, it is an object of the present invention to provide a compact distributed-parameter network for transmission of applied electrical signals.

A more specific object of the invention is to provide a compact distributed-parameter network which has low power losses and which has a greater frequency bandwidth than heretofore obtainable.

A still more specific object of the invention is to provide a compact distributed-parameter network with a means for optimizing the phase response of electrical signals applied to it.

SUMMARY OF THE INVENTION

The invention provides a compact distributed-parameter network for transmission of applied electrical signals with a predetermined characteristic impedance having a substrate of dielectric material with at least two parallel major surfaces. A coil having a plurality of coplanar turns of electrically conductive material in a spirallike configuration of concentric squares in the center area of the coil and of concentric octagons in the outer area of the coil is affixed to and supported by one of the substrate parallel major surfaces, and a ground plane comprising a plurality of electrically joined segments of electrically conductive material is affixed to and supported by the parallel major surface opposite the spirallike coil in asymmetrical juxtaposition therewith.

BRIEF DESCRIPTION OF THE DRAWING

The features of the present invention which are believed to be novel are set forth with particularity in the appended claims. The invention, together with further objects and advantages thereof, may best be understood by reference to the following description taken in connection with the accompanying drawings, in the several figures of which like reference numerals identify like elements, and in which:

DESCRIPTION OF THE PREFERRED EMBODIMENT

Figures 1, 2, 3, 4, 5:
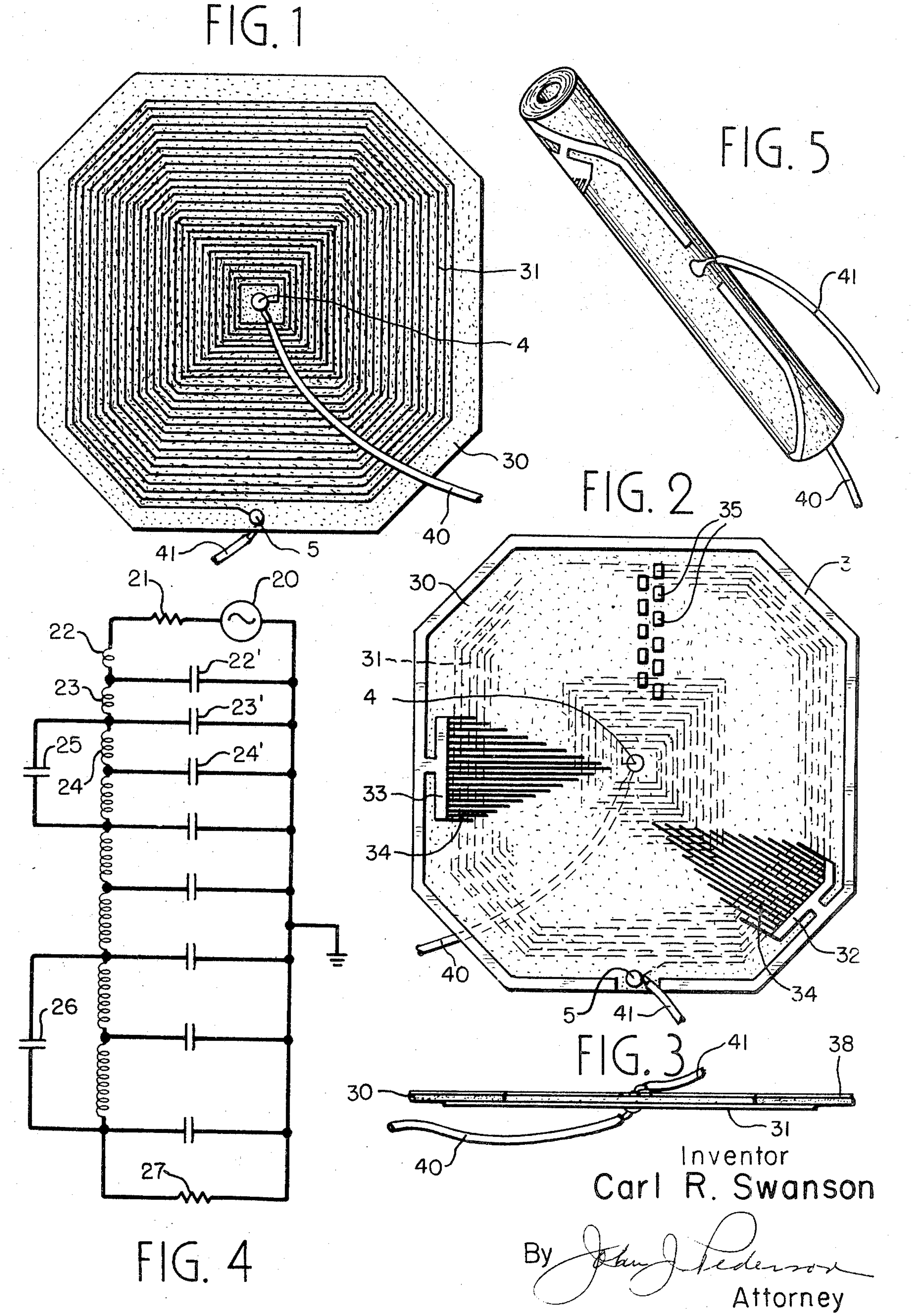
FIG. 1 is a top view of a distributed-parameter network embodying the invention.
FIG. 2 is a bottom view of the distributed-parameter network of FIG. 1.
FIG. 3 is a side view of the distributed-parameter network shown in FIG. 1.
FIG. 4 is a schematic diagram of an equivalent circuit for a preferred embodiment of the present invention.
FIG. 5 is a perspective view of the preferred embodiment rolled up and ready for packaging or use.

A distributed-parameter network 1 embodying the present invention is shown in FIG. 1. The dielectric substrate 30 as shown is octagonal but may be of any shape and may of course by part of a complete thick-film microcircuit substrate. It is preferably formed of a low-K flexible plastic dielectric material. The coplanar spirallike coil turns 31 concentric squares in the center area of the coil and of concentric octagons in the outer area of the coil are affixed to and supported by one of the parallel major surfaces areas of the substrate 30. The coplanar turns are preferably deposited onto the substrate by any of the well-known printing techniques such as silk screening or for that matter by stenciling, photoetching, or the like.

The number of coil turns, the width of the coil turns, and the spacing between the coil turns, can be chosen to suit the particular inductance requirements of the desired network.

The spirallike coil is provided with terminals 4 and 5 at its ends which are connected to leads 40 and 41, respectively, as shown in FIG. 2, for connecting the network to its accompanying circuitry (not shown).

On the parallel major surface opposite coil 31 is a ground plane comprising ground plane segments 32 and 33 each comprising electrically joined laterally spaced, parallel conductive strips 34 affixed to and supported by the opposite major surface as shown in FIG. 2. The segmented ground plane in asymmetrical juxtaposition with the coil and the laterally spaced, parallel conductive strips 34 eliminates the eddy current losses which would result if a continuous sheet of electrically conductive material were used for the ground plane. This also results in a greater width of the frequency passband of the network.

The ground plane segments are triangular in shape and point essentially towards the center of the coil providing a relative constant inductance-to-capacitance ratio for each turn of the coil, resulting in a uniform characteristic impedance throughout the network. Other impedance characteristics for special applications may be provided by appropriate shaping of the ground plane segments.

Ground plane segment 32 lies at least partially beneath one set of the essentially concentric corners of the coil squares so that the laterally spaced, parallel conductive strips 34 overlap adjacent sides of the squares and octagons, not only creating distributed shunt capacitance for each coil turn, but also small bridging capacitances across adjacent turns of coil 31 and also across adjacent sides of the individual square and octagonal turns. These small bridging capacitances help extend the range of substantially linear transmission of electrical signals applied to the network as compared with the range obtainable with a conventional circular spiral coil configuration. By changing the position of ground plane segment 32 over this prescribed area of the coil, the characteristics of the network may be varied to obtain the desired phase response. Strips 34 extend substantially perpendicular with respect to the individual coil turns on the opposite side of substrate 30, to avoid undesired inductive coupling between adjacent turns of the coil which would otherwise be contributed by the ground plane to optimize the linear transmission of applied signals without compromising on the width of the frequency passband of the network. Preferably, the individual strips 34 are radially oriented as shown.

At least two rows of rectangular conductive patches 35 are affixed to and supported by the surface which supports the ground plane. The patches are preferably deposited onto the substrate concurrently with the ground plane segments. The patches of each row are staggered with respect to those of neighboring rows, and the rows are oriented so that they are essentially perpendicular to the turns of coil 31. These patches provide the majority of the bridging capacitance across the adjacent turns of coil 31 to achieve the optimum phase transmission of electrical signals applied to the network. The staggering of the various rows of rectangular patches also results in a continuity of bridging capacitance between adjacent turns, thus providing an essentially flat characteristic impedance within the passband.

FIG. 3 is a side view of this novel distributed-parameter network. Here the parallel major surfaces 36 and 37 of substrate 30 can be clearly seen. Coil 31 is affixed to major surface 36 and ground plane elements 32 and 33 are affixed to major surface 37.

The size of the network can be easily controlled when using any of the aforementioned methods, but the photoetch method is particularly convenient because it provides a continuous size reduction or magnification possibility. Use of photographic processing also lends itself to the easy deletion or shape change of ground plane elements by covering up portions of the photomask during exposure of the substrate.

It can be seen that a network embodying the present invention is compatible with manufacturing techniques and processes used in the production of thick-film microcircuits. The segmented ground plane in asymmetrical juxtaposition with the coil reduces eddy current losses resulting in broader frequency bandwidths. The geometrical shape of the coil turns along with the overlapping ground plane segments and the rows of rectangular conductive patches provide a convenient means for extending the optimum phase transmission of electrical signals applied to the network.

The novel distributed-parameter network of the invention is particularly suited for applications where a controlled phase response is desired. By appropriately positioning the ground plane segments over the adjacent sides of the squares and octagons and over the straight sides of the coil turns, almost any phase characteristic can be obtained. This feature has not been provided by prior art structures.

The novel distributed-parameter network of the invention is preferably used as a time delay network. The equivalent circuit for such a network is shown in FIG. 4. The delay network is driven by source 20 which has an internal resistance 21 equal to the characteristic impedance of the delay network. The delay network comprises an inductance with an appropriate amount of shunted capacitance distributed down the line. This distributed capacitance in conjunction with the inductance of the coil establishes the characteristic impedance of the network. For a uniform characteristic impedance, the ratio between inductance 22 and distributed capacitance 22' is essentially the same as the ratio between inductance 23 and distributed capacitance 23' and so on down the line. Bridging capacitances 25 and 26 may be provided to extend the range of substantially optimum transmission, as to amplitude and phase delay, of electrical signals applied to the network. Resistor 27 terminates the delay line in its characteristic impedance, eliminating the standing waves.

This equivalent circuit is obtainable with the distributed-parameter network previously described and shown in FIGS.1–3. In its preferred application, the invention is embodied in a delay line for color television receivers, As shown, just two ground plane segments 32 and 33 are needed to provide the proper amount of shunt capacitance (e.g., 22', 23', in FIG. 4) down the line. Ground plane segments 32 and 33 are electrically joined by ring 38 which can also be deposited onto the substrate 30 concurrently with the ground plane segments. As previously explained, ground plane segment 32, by overlapping the adjacent sides of the individual square and octagonal turns, establishes bridging capacitance between adjacent sides of the individual coil turns as well as between adjacent coil turns to extend the optimum transmission of electrical signals applied to the network. Also to this end, the staggered rows of rectangular conducting patches 35 create additional bridging capacitance across adjacent turns of coil 31.

For optimum performance as a luminance delay line in a color television receiver, it is preferred that ground plane segment 33 be located in juxtaposition with only adjacent sides and not corners or adjacent turns, as shown.

The segmentation of the ground plane elements, by forming them of laterally spaced, parallel conductive strips, minimizes eddy current losses and enhances the width of the frequency passband sufficient for this application.

A relatively constant inductance-to-capacitance ratio is obtained by the triangular configuration of ground plane segments 32 and 33 pointing towards the center of coil 31.

This delay line is capable of delaying electrical signals in the video frequency range for luminance application in modern color television receivers by approximately 1 microsecond, with a characteristics impedance of approximately 600 ohms. Typically, the diameter of spirallike coil 31 may be 5 inches having 70 total turns and resulting in an overall inductance of 340 microhenries. The substrate may be a 0.002-inch thick polyester-polyolefin laminated sheet having a 0.0005-inch thick polyester laminated to 0.0015-thick polyolefin, having a dielectric constant of 3.5 at 1 megahertz. This dielectric material is flexible, allowing the delay line to be rolled up before its final packaging and use.

The delay line in its rolled up configuration is shown in FIG. 5. Leads 40 and 41 connect the delay line to its accompanying circuitry (not shown).

One method of retaining the delay line in this rolled-up configuration may be to roll up the delay line and cement the free end of the network to the resulting cylindrical configuration. One suitable cement for this purpose is M and W number 480. The delay line then may be incorporated into its accompanying circuitry or packaged if so desired.

The delay line may be reduced in size by the use of modern photoetch or screening techniques well known in the art, and different network characteristics may be obtained by adding or deleting ground plane segments or by changing their shape or position while maintaining asymmetry in their juxtaposition with the coil winding.

The invention provides inductance-capacitance networks for thick-film microcircuit substrates or similar structures which display network characteristics far superior to those obtainable heretofore. Greater frequency bandwidths may be achieved and a convenient means for extending the linear transmission of applied electrical signals is provided.

While a particular embodiment of the invention has been shown and described, it will be obvious to those skilled in the art that changes and modifications may be made without departing from the invention in its broader aspects, and, therefore, the aim in the appended claims is to cover all such changes and modifications as may fall within the true spirit and scope of the invention.

I claim:

1. A compact distributed-parameter network for transmission of applied electrical signals with a predetermined characteristic impedance, comprising:

a substrate of dielectric material having at least two parallel major surfaces;

a coil affixed to and supported by one of said major surfaces, and having a plurality of coplanar turns of electrically conductive material in a spirallike configuration of concentric square turns in the center area of said coil and of concentric octagonal turns in the outer area of said coil;

and a ground plane comprising a plurality of electrically joined segments of electrically conductive material affixed to and supported by the major surface opposite said spirallike coil in asymmetrical juxtaposition therewith.

2. A distributed-parameter network in accordance with claim 1, where said ground plane segments are composed of a series of electrically joined, laterally spaced, parallel conductive strips for minimizing eddy currents and thereby minimizing power loss and enhancing the width of the frequency passband of said network.

3. A distributed-parameter network in accordance with claim 1, where at least two rows of rectangular conductive patches are also affixed to and supported by the substrate opposite said coil, said patches of each row being staggered with respect to those of neighboring rows, and said rows being oriented so that they are essentially perpendicular to said spiral coil turns for establishing bridging capacitances between adjacent turns of said coil to extend the frequency range of optimized phase transmission of said signals applied to said network.

4. A distributed-parameter network in accordance with claim 1, where said ground plane includes a segment composed of a series of electrically joined, laterally spaced, parallel conductive strips overlapping adjacent sides of individual square and said octagonal turns to establish small bridging capacitances between adjacent turns of said coil and also between adjacent sides of individual square and octagonal turns to aid the optimum phase transmission of said signals applied to said network.

5. A distributed-parameter network in accordance with claim 1, where said ground plane includes at least two segments composed of a series of electrically joined, laterally spaced parallel conductive strips, one such segment overlapping corners of at least some of said square and said octagonal turns, and the other such segment overlapping only the straight sides of said coil turns, to establish small bridging capacitances between adjacent turns of said coil and also between adjacent sides of individual square and octagonal turns to optimize the phase response transmission of said signals applied to said network.

6. A distributed-parameter network in accordance with claim 1, which exhibits a relatively constant inductance-to-capacitance ratio for each spiral coil turn, and in which said ground plane comprises at least one essentially triangularly shaped segment with an orientation such that such element points essentially toward the center of said spiral coil.

7. A distributed-parameter network in accordance with claim 1, where said substrate is of a flexible material and where said network is in a rolled-up configuration.

8. A distributed-parameter network in accordance with claim 1, where said ground plane includes a segment composed of a series of electrically joined, laterally spaced, parallel conductive strips overlapping the straight sides of said coil turns and extending substantially transversely with respect to the individual coil turns on the opposite of said substrate avoiding inductive coupling between the adjacent turns of said coil which otherwise would be attributable to said ground plane strips.

9. A compact distributed-parameter time delay network for transmission of applied electrical signals with a predetermined characteristic phase delay time and a predetermined characteristic impedance, which minimizes eddy current losses and enhances the width of the frequency range of optimized phase transmission of electrical signals, comprising:

a substrate of dielectric material having at least two parallel major surfaces;

a coil affixed to and supported by one of said major surfaces, and having a plurality of coplanar turns of electrically conductive material in a spirallike configuration of essentially concentric square turns in the center area of said coil and of essentially concentric octagonal turns in the outer area of said coil;

a ground plane comprising a series of electrically joined, laterally spaced, parallel conductive strips, affixed to, and supported by the major surface of said substrate opposite said coil in asymmetrical juxtaposition therewith, with said ground plane overlapping at least one set of adjacent sides of individual ones of said square and octagonal turns;

and at least two rows of rectangular conductive patches also affixed to and supported by the surface supporting said ground plane, said patches of each row being staggered with respect to those of neighboring rows, and said rows being oriented so that they are essentially perpendicular to said spiral coil turns.

* * * * *